US 6,759,185 B2
Jul. 6, 2004

(12) United States Patent
Fiebag et al.

(10) Patent No.: US 6,759,185 B2
(45) Date of Patent: Jul. 6, 2004

(54) METHOD FOR REUSE OF LOADED DEVELOPER

(75) Inventors: Ulrich Fiebag, Rosenweg (DE); Hans-Joachim Timpe, Baumhofstrasse (DE); Uwe Tondock, Langer Hagen (DE); Andreas Vihs, Bachstrasse (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 239 days.

(21) Appl. No.: 09/992,688

(22) Filed: Nov. 14, 2001

(65) Prior Publication Data

US 2003/0089669 A1 May 15, 2003

(51) Int. Cl.[7] .......................... G03C 5/31; B01D 21/01
(52) U.S. Cl. ...................... 430/399; 430/302; 210/732; 210/746
(58) Field of Search ................ 430/399, 302; 210/732, 746

(56) References Cited

U.S. PATENT DOCUMENTS

| 3,589,261 A | 6/1971 | Krikelis | 396/622 |
|---|---|---|---|
| 4,259,434 A | 3/1981 | Yamasue et al. | 430/302 |
| 4,786,417 A | 11/1988 | Miki et al. | 210/639 |
| 4,961,859 A | 10/1990 | Uehara et al. | 210/725 |
| 5,124,736 A | 6/1992 | Yamamoto et al. | 354/325 |
| 5,811,224 A | 9/1998 | Seeley et al. | 430/399 |
| 6,153,107 A | 11/2000 | Ogawa et al. | 210/710 |
| 6,247,856 B1 | 6/2001 | Shibano et al. | 396/565 |
| 2003/0211429 A1 * | 11/2003 | Fiebag et al. | 430/398 |

FOREIGN PATENT DOCUMENTS

| DE | 4120075 | 12/1992 |
|---|---|---|
| EP | 0520793 | 12/1992 |
| EP | 0732628 | 9/1996 |
| EP | 0747773 | 12/1996 |

* cited by examiner

Primary Examiner—John S. Chu
(74) Attorney, Agent, or Firm—RatnerPrestia

(57) ABSTRACT

A method for the refreshment and reuse of loaded developers used in lithographic printing is disclosed. A polyoxyalkylene derivative is added to a silicate-containing loaded developer. Insoluble material is separated and the alkalinity level of the resulting essentially colorless liquid adjusted to produce a refreshed developer. The refreshed developer may be used to develop additional exposed imageable elements.

12 Claims, No Drawings

METHOD FOR REUSE OF LOADED DEVELOPER

FIELD OF THE INVENTION

This invention relates to lithographic printing. In particular, this invention relates to a method for the reuse of loaded developers.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise an imageable layer applied over the surface of a hydrophilic substrate. The imageable layer includes one or more radiation-sensitive components, which may be dispersed in a suitable binder. Alternatively, the radiation-sensitive component can also be the binder material.

To obtain a printing plate with imagewise distribution of printable regions, it is necessary to remove regions of an imaged imageable element. The most common method for removing the undesired regions is to contact the imaged element with a developer. If after exposure to radiation the exposed regions of the layer are removed by the developer revealing the underlying hydrophilic surface of the substrate, the element is a positive-working printing element. Conversely, if the unexposed regions are removed, the element is a negative-working element. In each instance, the regions of the imageable layer (i.e., the image areas) that remain after development are ink-receptive, and the regions of the hydrophilic surface revealed by the developing process accept water and aqueous solutions, typically a fountain solution, and repel ink.

Many alkaline-developable positive-working imageable elements comprise an imageable layer comprising a phenolic resin, such as a novolac resin, on a hydrophilic substrate, typically a specially treated aluminum sheet. For example, in one type of element the light sensitive layer comprises a novolac resin and a o-diazoquinone or diazonaphthoquinone, such as a naphthoquinonediazide sulfonic acid ester of a novolac resin. Upon exposure to ultraviolet light, the diazonaphthoquinone is converted to the corresponding carboxylic acid. The developer penetrates and removes the exposed regions of the imageable layer, revealing the underlying hydrophilic surface of the substrate, without substantially affecting the complimentary unexposed regions. During the printing process, the unexposed regions act as the image regions and accept ink.

The imageable layers of certain negative-working printing plates comprise a novolac resin, a cross-linking agent, and a radiation-sensitive component that produces acid on exposure. Subsequent heating cures the exposed regions, so that only the unexposed areas can be removed by an alkaline developer. The exposed regions, which remain after development, are oleophilic and will accept ink.

During the development process, the developer becomes loaded with components of the imageable layer that have been removed during development. Although some of the partly loaded developer is removed from the developing bath with the developed printing plates (drag-out) and is replaced with a replenisher, the amount of material in the developer increases as more imageable elements are developed. Once the developer becomes fully loaded, scum will form on the developed printing plates and on the components of the processor. The developer then must be replaced with fresh developer and the loaded developer disposed of.

Because of environmental considerations, the loaded developer must be treated before disposal to render it non-hazardous. If the loaded developer could be reused, it would be unnecessary to dispose of loaded developer and to prepare fresh developer. Thus, a need exists for a method for reusing loaded developer.

SUMMARY OF THE INVENTION

The invention is a method for producing a refreshed developer from a loaded developer. The method comprises the steps of:

(a) adding about 0.8 wt % to about 5.0 wt % of a water-soluble polyoxyalkylene derivative to a loaded silicate-containing developer, in which:

the polyoxyalkylene derivative comprises recurring units of the —($CH_2$—CHR—O)— structural unit, in which each R is independently hydrogen or methyl;

the loaded developer comprises loaded solids; and the loaded developer has a loaded solids content of about 0.1 wt % to about 10 wt %;

(b) separating insoluble material from the developer and producing an essentially colorless liquid, in which the insoluble material comprises material dispersed in the loaded developer, a precipitate formed in step (a), or a combination thereof; and (c) adjusting the alkalinity level of the essentially colorless liquid and producing the refreshed developer.

The refreshed developer may be used to develop imaged imageable elements. Or it may be mixed with fresh developer and used to develop imaged imageable elements.

DETAILED DESCRIPTION OF THE INVENTION

Production of the Refreshed Developer

In one aspect, the invention is a method for the recovery and reuse of loaded developer. Imaging, as described below, produces an imaged precursor, which comprises a latent image of image regions and non-image regions in an imageable layer. Development of the imaged precursor to form a printing plate, or printing form, converts the latent image to an image by removing the non-image regions, revealing the hydrophilic surface of the underlying substrate.

As described below, the imageable layer of imageable elements comprises materials that are soluble or dispersible in aqueous base, such as phenolic polymers, carboxylic acid polymers, and/or sulfonamide polymers. The developers used in the process of the invention have a pH before loading of greater than about 12, typically about 12 to about 14, more typically from about 12.5 to about 13.7. In addition, the developers comprise of silicates. Typically these developers comprise about 1 wt % to about 20 wt %, based on the weight of the developer, of a silicate. The silicate is typically sodium silicate, potassium silicate, sodium waterglass or potassium waterglass, i.e. silicates with a molar ratio of $SiO_2$ to $M_2O$ (with M=alkali metal) of 2 or more. Developers that comprise silicates are disclosed, for example, in Yamasue, U.S. Pat. No. 4,259,434; Seino, U.S. Pat. No. 4,452,880; Miller, U.S. Pat. No. 5,851,735; Eckler, U.S. Pat. No. 5,998,102; Miro, EP-A-0 732 628; Toyama,GB-A-2,276, 729 (DE-A-4 411 176); and Fiebag, U.S. Pat. No. 6,143,479.

The alkalinity is provided using a suitable concentration of any suitable chemical base, such as an alkali metal hydroxide, such as sodium hydroxide, lithium hydroxide or potassium hydroxide. The alkalinity level is defined as the volume of 0.5 N hydrochloric acid (HCl) in mL needed to reach the first inflection point in the titration of 5 mL of developer. The developer typically has an alkalinity level of about 4.5 to about 10.0, preferably about 5.5 to about 8.0.

In addition, the developer may comprise one or more components that suppress the attack of the alkali on the substrate and/or the imageable layer, for example phosphonic acid derivatives such as the sodium salt of hydroxyethane diphosphonic acid and the potassium salt of hexamethylene diamino-tetramethylenephosphonic acid (typically about 0.01 to about 5 wt %; more typically about 0.1 to about 1 wt %, based on the weight of the developer), and glycols such as ethylene glycol and propylene glycol. Other optional components include one or more surfactants (anionic, nonionic and/or amphoteric) in a suitable amount (for example up to 5 wt % based on the total composition weight), chelating agents (such as ethylenediaminetetraacetic acid, diethylene-triaminepentaacetic acid, triethylenetetraaminehexaacetic acid, hydroxyethyl-ethylenediaminetriacetic acid and their alkali metal and ammonium salts), and biocides (antimicrobial or antifungal agent). One or more antifoaming agents, such as certain silicones, may also be included.

Typically, the developer is applied to the imaged precursor by rubbing or wiping the imageable layer with an applicator containing the developer. Alternatively, the imaged precursor may be brushed with the developer or the developer may be applied to the precursor by spraying the imageable layer with sufficient force to remove the exposed regions. In either instance, a printing plate is produced.

Development of both positive-working and negative-working imaged precursors is typically carried out at a temperature of from about 18° C. to about 28° C., for a period of from about 5 seconds to about 60 seconds. Development may be carried out in a commercially available processor, such as a Mercury Processor (Kodak Polychrome Graphics).

To achieve constant activity for the developer, a replenisher is periodically added to the developer bath so that a balance between developer feed-in and both developer consumption due to the introduction of components removed from the imaged imageable elements and developer drag-out is reached. Because there is a correlation between the electric conductivity and the alkalinity level of the developer bath, the activity of some developers can be monitored by conductivity. After a certain number of imaged precursors have been processed, the conductivity value falls below a predetermined level. As soon as a reduction of electrical conductivity is detected, replenisher is added to the section of the processor that contains the developer until the electrical conductivity of the developer reaches its original value. Typically about 30 mL to about 100 mL, more typically about 50–80 mL, of replenisher per 1 $m^2$ of imaged precursor processed is necessary to keep both the alkalinity level of the developer and its conductivity value substantially constant.

The alkalinity of the developer can be measured by titration of an aliquot of the developer with an acid, such as hydrochloric acid. This is necessary for developers whose conductivity cannot be readily measured, such as developers that work with the top-up mode in which the developer is used to replace the alkalinity lost during the developer loading cycle. In these cases, the conductivity changes throughout the developer loading cycle.

During development, the developer becomes loaded with components of the imageable layer that have been removed during development. Although some of the developer is removed with the developed printing plates (drag-out) and is replaced with the replenisher, the developer eventually becomes fully loaded with components of the imageable layer. The loaded developer contains solid material dispersed in the developer and/or material dissolved in the developer. Typically a developer comprises about 0.1 wt % to about 10 wt % of material derived from the imageable elements ("loaded solids"), more typically about 4 wt % to about 6 wt % of loaded solids, when fully loaded.

The loaded solids can be removed by a process in which a polyoxyalkylene derivative is added to the loaded developer. Solid material is separated from the resulting liquid to form an essentially colorless liquid. Typically, about 0.8 wt % to about 5.0 wt %, preferably about 1.2 wt % to about 2.5 wt %, based on the weight of the of the loaded developer is added to the loaded developer. The loaded developer is typically stirred during addition of the polyoxyalkylene derivative.

After polyoxyalkylene derivative is added to the loaded developer, the resulting liquid comprises solid material. The solid material may be developer insoluble material that was dispersed in the developer before the polyoxyalkylene derivative was added, a precipitate that was formed when the polyoxyalkylene derivative was added, or a combination thereof. This solid material, including any precipitate formed when the polyoxyalkylene derivative was added, is separated and removed. Any solid/liquid separation process may be used to separate the solid material, such as, for example, filtration or centrifugation. After the solid is separated, the resulting liquid is typically obtained as a clear, colorless liquid. Essentially all the solids in the developer derived from the imageable elements (the loaded solids) are removed by this process. Although the amount of water-soluble polyoxyalkylene derivative remaining in the clear colorless liquid after this process will vary with the structure of the water-soluble polyoxyalkylene derivative, it is thought that typically about 0.1 wt % to 0.9 wt %, and more typically about 0.2 wt % to 0.4 wt %, of the water-soluble polyoxyalkylene derivative remains after this process.

For a reuse of this essentially colorless liquid as refreshed developer, its alkalinity must be adjusted to about the alkalinity level of the original developer. The alkalinity of the essentially colorless liquid can be measured by titration of an aliquot with an acid, such as hydrochloric acid. As described above, alkalinity level is defined as the volume of 0.5 N HCl in mL needed to reach the first inflection point in the titration of 5 mL of developer. The alkalinity can be adjusted by addition of a base, typically the base used for the production of the initial developer, for example an aqueous solution of sodium or potassium hydroxide. The alkalinity level of the refreshed developer is adjusted to about 4.5 to about 10.0, preferably to about 5.5 to about 8.0.

Adjustment of the concentration the silicate containing components is not necessary to produce the refreshed developer.

The refreshed developer may be used to develop additional imaged imageable elements. Or the refreshed developer may be mixed with fresh developer to develop additional imaged imageable elements.

Following development, the printing plate is rinsed with water and dried. Drying may be conveniently carried out by infrared radiators or with hot air. After drying, the printing plate may be treated with a gumming solution. A gumming solution comprises one or more water-soluble polymers, for example polyvinyl alcohol, polymethacrylic acid, polymethacrylamide, polyhydroxyethyl-methacrylate, polyvinylmethylether, gelatin, and polysaccharide such as dextran, pullulan, cellulose, gum arabic, and alginic acid. A preferred material is gum arabic. A developed and gummed plate may also be baked to increase the run length of the plate. Baking can be carried out, for example at about 220° C. to about 260° C. for about 3 to 10 minutes, or at a temperature of 120° C. for 30 min.

Polyoxyalkylene Derivatives

The polyoxyalkylene derivatives are water-soluble polyethyoxylated and/or polypropoxylated compounds. That is, compounds that comprises recurring units of the —($CH_2$—CHR—O)— structural unit, in which each R is independently hydrogen or methyl. The compounds are typically prepared by reaction of an alcohol, phenol, amine, etc., with ethylene oxide, with propylene oxide, or with both ethylene oxide and propylene oxide. The polyoxyalkylene sequence may consist entirely of oxyethylene units [—($CH_2$—$CH_2$—O)—] or of oxypropylene units [—($CH_2$—$CH(CH_3)$—O)—]. Or it may comprise both oxyethylene units and oxypropylene units, either in a random sequence or in blocks.

Numerous polyethoxylated and polypropoxylated compounds are available from various suppliers under various trade names and are described, for example, in *Industrial Chemical Thesaurus*, 2nd ed., Vol. 1 and 2, M. Ash and I. Ash, Editors, VCH Publishers, New York. 1992. The compounds and tradenames listed below are only examples of numerous compounds that are available or could be prepared. Mixtures of these compounds may also be used.

A preferred group of polyoxyalkylene derivatives are polypropylene oxides, i.e. compounds of the structure: HO[—($CH_2$—$CH(CH_3)$—O)$_n$—]H. n is preferably about 8 to about 40, more preferably about 9 to about 20. Polypropylene oxides of varying molecular weight are commercially available. For example PPG-9 (polymer containing 9 moles of propylene oxide, i.e. n is 9) (PLURACOL® P-410, BASF); PPG-12 (PLURACOL® P-710, BASF); PPG-17 (PLURACOL® P-1010, BASF); PPG-20 (MACOL® P-1200, PPG); PPG-26 (MACOL® P-2000, PPG); and PPG-30; PPG-34.

Polycondensation products of at least one $C_2$–$C_3$ alkylene oxide with ethylene diamine are another group of preferred polyoxyalkylene derivatives. A preferred group of these compounds is the polyoxyethylene, polyoxypropylene block copolymers of ethylene diamine, which are known as poloxamines [CAS #11111-34-5]. Commercially available poloxamines include, for example, poloxamine 304, poloxamine 504, poloxamine 701, poloxamine 702, poloxamine 704, poloxamine 707, poloxamine 901, poloxamine 904, poloxamine 908, poloxamine 1101, poloxamine 1102, poloxamine 1104, poloxamine 1107, poloxamine 1301, poloxamine 1302, poloxamine 1304, poloxamine 1307, poloxamine 1501, poloxamine 1502, poloxamine 1504, and poloxamine 1508. Polyoxyethylene, polyoxypropylene block copolymers of ethylene diamine are commercially available under the SYNPERONIC® T (ICI, Uniqema) and TETRONIC® (BASF) tradenames.

The polyoxyalkylated derivatives of amines, especially polyoxyalkylated derivatives of monoalkyl and dialkyl monoamines (i.e., primary and secondary amines) are another preferred group of polyoxyalkylene derivatives. Examples are alkylamino-polyethoxypolypropoxy propanol (TRITON® CF32, Rohm & Haas) and polyoxyalkylsteramines.

Other useful polyoxyalkylene derivatives may be selected from the following materials. Polyoxyethylene/polyoxypropylene/polyoxyethylene, A-B-A block copolymers of ethylene oxide and propylene oxide, which are referred to as poloxamers [CAS #9003-11-6], are another group of polyoxyalkylene derivatives. Commercially available poloxamers include, for example, poloxamers 101, 105, 108, 122, 123, 124, 181, 182, 183, 184, 185, 188, 212, 215, 217, 231, 234, 235, 237, 238, 282, 284, 288, 313, 333, 334, 335, 338, 401, 402, 403, and 407. These compounds are available under the PLURONIC® (BASF), MACOL® (PPG/Specialty Chem,), and SYNPERONIC® PE (ICI, Uniqema) tradenames.

Random copolymers of ethylene oxide and propylene oxide (PEG/PPG copolymers), with various molecular weights and with various ratios of ethylene oxide to propylene oxide are available, for example, under the UCON® tradename (Union Carbide). Examples are: UCON® 75-H-90000, a random copolymer of 125 moles of ethylene oxide and 30 moles of propylene oxide; UCON® 75-H-450, a random copolymer of 17 moles of ethylene oxide and 6 moles of propylene oxide; UCON® 75-H-490, a random copolymer of 18 moles of ethylene oxide and 4 moles of propylene oxide; UCON® 25-H-205, a random copolymer of 23 moles of ethylene oxide and 50 moles of propylene oxide; UCON® 75-H-1400, a random copolymer of 35 moles of ethylene oxide and 9 moles of propylene oxide.

Polyethylene oxides of varying molecular weight are commercially available, for example as POLYOX® water-soluble polymers (Amerchol) and as RITA PEOs (R.I.T.A. Corp.). Examples include: POLYOX® WSR N-60K (MW about 2,000,000); POLYOX® WSR N-750 (MW about 600,000); RITA PEO-1 (MW about 210,000); RITA PEO-2 (MW about 400,000); RITA PEO-3 (MW about 1,000,000); RITA PEO-8 (MW about 1,900,000); RITA PEO-18 (MW about 4,400,000); RITA PEO-27 (MW about 7,200,000).

The polyethoxylated alkyl phenols, especially nonyl phenol (nonyloxynols) and octyl phenol (octoxynols) ethoxylated with varying amounts of ethylene oxide, are widely available. Examples include: octoxynol-4 (i.e., octylphenol ethoxylated with four moles of ethylene oxide); octoxynol-5 (TRITON® X-45, Union Carbide); octoxynol-6; octoxynol-7; octoxynol-8 (TRITON® X-1114, Union Carbide); octoxynol-9 (TRITON® X-100, Union Carbide; IGEPAL® CA-630, Rhone-Poulenc); octoxynol-10; octoxynol-11; octoxynol-12; octoxynol-13 (TRITON® X-102, Union Carbide; IGEPAL® CA-720, Rhone-Poulenc); octoxynol-20 (Synperonic OP20, ICI Americas); nonyloxynol-4 (TERGITOL® NP-4, Union Carbide); nonyloxynol-6 (TERGITOL®NP-6, Union Carbide); nonyloxynol-7; nonyloxynol-8; nonyloxynol-9 (TERGITOL® NP-9, Union Carbide); nonyloxynol-10 (TERGITOL® NP-10, Union Carbide; IGEPAL® CO-660, Rhone-Poulenc); nonyloxynol-15 (TERGITOL® N-15, Union Carbide); and nonyloxynol-20 (TERGITOL® N-20, Union Carbide). Ethoxylated derivatives of aliphatic alcohols include, for example, deceth-6 (TRYCOL® 5952, Henkel) (i.e., decanol ethoxylated with six moles of ethylene oxide); laureth-4 (BRIJ® 30, ICI); laureth-5; laureth-9; laureth-10 (Dehydrol 100 Henkel); laureth-20 (MARLOWET® LMA 20, Huls); ceteth-4; ceteth-10 (MACOL® CA-10, PPG); ceteh-12; ceteh-16; and ceteth-20 (DERMALCARE® C-20, Rhone-Poulenc). Compounds that contain polyethoxylated mixtures of aliphatic alcohols are also available.

Polypropoxylated derivatives of aliphatic alcohols available under the UCON® tradename (Union Carbide) include, for example, PPG-5 butyl ether (i.e., butyl alcohol reacted with 5 moles of propylene oxide) (UCON® LB-65); PPG-15 butyl ether (UCON® LB-285); PPG-22 butyl ether UCON® LB-525); PPG-40 (UCON® LB-1715); and PPG-53 (UCON® LB-3000).

Water-soluble esters of the general structure may be used as the polyoxyalkylene derivative:

$$R^1CO-(OCH_2CHR)_nOH$$

in which $R^1$ is an alkyl group of two to twenty carbon atoms, preferably eight to sixteen carbon atoms.

Examples include: PEG-6 laurate (KESSCO® PEG 300 ML, Stepan), PEG-8 laurate (MAPEG® 400 ML, PPG), PEG-8 stearate (Nopalcol 4-S Henkel), PEG-10 stearate (ETHOFAT® 60/20, Akzo), PEG-8 myristate, PEG-20 myristate, PEG-8 oleate (Nopalcol 4-O, Henkel), and PEG-12 oleate (Nopalcol 6-O, Henkel).

Imageable Elements

The imageable elements that can be developed with the refreshed developer are well known. They comprise an imageable layer over a hydrophilic surface of a hydrophilic substrate. Other layers may also be present.

The imageable layer comprises a polymeric material, or a mixture of polymeric materials, that is either (a) dispersible in an aqueous solution that has a pH of about 12.0 to about 14.0 or (b) soluble in an aqueous solution that has a pH of about 12.0 to about 14.0 and insoluble in an aqueous solution that has a pH below about 11.0. Other layers, such as an underlayer between the support and the imageable layer, and/or an absorber layer between the imageable layer the support or, if present, the underlayer, may also be present, provided these layers do not comprise polymeric materials that are not either (a) soluble or dispersible in an aqueous solution that has a pH of 12.0 to 14.0 and (b) removable from an aqueous solution that has a pH below about 11.0.

The imageable elements may be "one layer plates," "two layer plates," "three layer plates," etc. If the imageable layer is the only layer present, the plate is a "one layer plate." If an underlayer is present between the imageable or top layer and the substrate, the plate is a "two layer plate." If an absorber layer is also present between the top layer and the underlayer, the plate is a "three layer plate."

There is no limitation on the number of layers that may be present in the imageable element, provided that each of the layers contains polymers and/or other ingredients that are soluble or dispersible in the developer and that are removable from the loaded developer by the process of the invention. Elements that comprise a layer of polyvinyl alcohol, for example, cannot be used in the process of the invention. Polyvinyl alcohol is not removed by addition of a polyoxyalkylene derivative to the loaded developer followed by solid/liquid separation.

The hydrophilic substrate, i.e., the substrate that comprises at least one hydrophilic surface, comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof. The surface of the aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 µm. Typically, the substrate comprises an interayer between the aluminum support and the imageable layer. The interlayer may be formed by treatment of the support with, for example, silicate, dextrine, hexafluorosilicic acid, phosphate/fluoride, polyvinyl phosphonic acid (PVPA), or polyvinyl phosphonic acid copolymers.

Positive-working photoimageable compositions, useful in the imageable or top layer of positive-working imageable elements, are well known. They are discussed, for example, in Chapter 5 of *Photoreactive Polymers: the Science and Technology of Resists*, A. Reiser, Wiley, N.Y., 1989, pp. 178–225. These compositions comprise a first polymeric material, which is a water insoluble, alkali soluble binder, as well as a material that comprises a photosensitive moiety. The photosensitive moiety may be bonded to the polymeric material and/or be present in a separate compound.

The first polymeric material may be a light-stable, water-insoluble, aqueous alkaline developer-soluble, film-forming polymeric material that has a multiplicity of phenolic hydroxyl groups, either on the polymer backbone or on pendant groups. Phenolic groups impart aqueous alkaline developer solubility to the imageable layer and also are believed to form a thermally frangible complex with a dissolution inhibitor. Novolac resins, resol resins, acrylic resins that contain pendent phenol groups, and polyvinyl phenol resins are preferred phenolic resins. Novolac resins are more preferred. Novolac resins are commercially available and are well known to those skilled in the art. Other phenolic resins useful as the polymeric material include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes. The first polymeric material may also be a water insoluble, base soluble polymeric compound having pendent sulfonamide groups, such as is described in Aoshima, U.S. Pat. No. 5,141,838 (EP 330,239).

The photosensitive moiety is typically the o-diazonaphthoquinone moiety. Compounds that contain the o-diazonaphthoquinone moiety (i.e., quinone-diazides), preferably compounds that comprise an o-diazonaphthoquinone moiety attached to a ballasting moiety that has a molecular weight of at least 1500, but less than about 5000, are preferred. Typically, these compounds are prepared by the reaction of a 1,2-naphthoquinone diazide having a halogeno-sulfonyl group, typically a sulfonylchloride group, at the 4- or 5-position with a mono- or poly-hydroxyphenyl compound, such as mono- or poly-hydroxy benzophenone.

Polymeric diazonaphthoquinone compounds include derivatized resins formed by the reaction of a reactive derivative that contains a diazonaphtho-quinone moiety and a polymeric material that contains a suitable reactive group, such as a hydroxyl or amino group. Suitable polymeric materials for forming these derivatized resins include the novolac resins, resole resins, polyvinyl phenols, acrylate and methacrylate copolymers of hydroxy-containing monomers such as hydroxystyrene. Representative reactive derivatives include sulfonic and carboxylic acid, ester, or amide derivatives of the diazonaphthoquinone moiety. Derivatization of phenolic resins with compounds that contain the diazonaphtho-quinone moiety is well known in the art and is described, for example, in West, U.S. Pat. Nos. 5,705,308, and 5,705,322.

One type of positive-working thermally imageable layer may comprise the first polymeric material and a dissolution inhibitor. Such systems are disclosed in, for example, Parsons, U.S. Pat. No. 6,280,899, incorporated herein by reference; Nagasaka, EP 0 823 327; Miyake, EP 0 909 627; West, WO 98/42507; and Nguyen, WO 99/11458. The polymeric material is typically a phenolic resin, such as a novolac resin.

Useful polar groups for dissolution inhibitors include, for example, diazo groups; keto groups; sulfonic acid ester groups; phosphate ester groups; onium groups, such as diazonium, sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. A preferred group of dissolution inhibitors are triarylmethane dyes, such as ethyl violet, crystal violet, malachite green, brilliant green, Victoria blue B, Victoria blue R, and Victoria blue BO. These compounds can also act as contrast dyes, which distinguish the unimaged regions from the imaged regions in the developed imageable element.

The dissolution inhibitor may be a compound that comprises an o-diazo-naphthoquinone moiety, such as is discussed above. The derivatized resins that comprise an o-diazonaphthoquinone moiety can act as both the polymeric material and the dissolution inhibitor.

An underlayer may be present. When present, the underlayer is between the hydrophilic surface of the hydrophilic substrate and the imageable layer or, if an absorber layer is present, between the hydrophilic surface of the hydrophilic substrate and the absorber layer. After imaging, it is removed in the imaged regions along with the imageable layer by the developer to expose the underlying hydrophilic surface of the substrate.

The underlayer comprises a second polymeric material that preferably is soluble in the developer. Polymeric materials useful as the second polymeric material include those that contain an acid and/or phenolic functionality, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof.

Solvent resistant underlayers are disclosed in Shimazu, WO 01/46318. Particularly useful polymeric materials are copolymers that comprise N-substituted maleimides, especially N-phenylmaleimide; polyvinylacetals; methacrylamides, especially methacrylamide; and acrylic and/or methacrylic acid, especially methacrylic acid. Other aqueous alkaline soluble monomers, such as acrylic acid, may be used in place of some or all of the methacrylic acid.

Another group of preferred polymeric materials for the second polymeric material are aqueous alkaline developer-soluble copolymers that comprise a monomer that has a urea bond in its side chain (i.e., a pendent urea group), such are disclosed in Ishizuka, U.S. Pat. No. 5,731,127.

Other aqueous alkaline developer-soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzenesulfonamide, or p-aminophenol, followed by ring closure by acid.

Another group of polymeric materials that are useful in the underlayer include aqueous alkaline developer-soluble copolymers that comprise about 10 to 90 mol % of a sulfonamide monomer unit, especially those that comprise N-(p-aminosulfonylphenyl)methacrylamide, N-(m-aminosulfonylphenyl)methacryl-amide N-(o-aminosulfonylphenyl)methacrylamide, and/or the corresponding acrylamide. Useful alkaline water-soluble polymeric materials that comprise a pendent sulfonamide group are disclosed in Aoshima, U.S. Pat. No. 5,141,838.

If the element is adapted for imaging with infrared radiation, it comprises a photothermal conversion material. Thermally imageable elements are imaged by exposure with infrared radiation and typically absorb radiation in the range of about 800 nm to 1200 nm, the range of radiation commonly used for imaging thermally imageable elements. An absorber, sometimes referred to as a photothermal conversion material, is present in the underlayer, the imageable layer, and/or a separate absorber layer. When an absorber layer is present, it is typically located between the imageable layer and the underlayer.

The photothermal conversion material is preferably located in the underlayer or in a separate absorber layer. The imageable layer is substantially free of photothermal conversion materials, i.e. the imageable layer preferably does not absorb radiation used for imaging, typically radiation in the range of 800 nm to 1200 nm. When an absorber layer is present, it preferably consists essentially of the photothermal conversion material and, optionally, a surfactant. It may be possible to use less of the photothermal conversion material if it is present in a separate absorber layer rather than either the underlayer and/or the imageable layer.

Photothermal conversion materials absorb radiation and convert it to heat. Photothermal conversion materials may absorb ultraviolet, visible, and/or infrared radiation and convert it to heat. Although the first polymeric material may itself comprise an absorbing moiety, i.e., be a photothermal conversion material, typically the photothermal conversion material is a separate compound.

The imaging radiation absorber may be either a dye or pigment, such as a dye or pigment of the squarylium, merocyanine, indolizine, pyrylium, or metal diothiolene class. Examples of absorbing pigments are Projet 900, Projet 860 and Projet 830 (all available from the Zeneca Corporation), and carbon black. Dyes, especially dyes with a high extinction coefficient in the range of 750 nm to 1200 nm, are preferred. Absorbing dyes are disclosed in numerous publications, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite 111-178 (Epoline), PINA-780 (Allied Signal), SpectralR 830A and SpectralR 840A (Spectra Colors), and Trump IR Dye (Eastman Kodak, Rochester, N.Y.).

The photothermal conversion materials, as well as any other colorants present in the imageable elements, should be removable from the loaded developer by the process of the invention. The material may be precipitated when the polyoxyalkylene derivative is added and removed during the solid/liquid separation step. Or it may be dispersed, rather than dissolved, in the developer and removed during the solid/liquid separation step. Or in may adhere to a precipitate formed when polyoxyalkylene derivative is added and removed during the solid/liquid separation step. That is, the precipitate may act as a flocculent for the colorant. Formation of an essentially colorless liquid during the solid/liquid separation step indicates that the colorant has been removed by the method of the invention.

The imageable element may comprise a negative-working, alkaline developable printing plate, typically one containing a novolac resin and/or another phenolic resin, is imagewise exposed with a suitable light source and heated to harden the exposed regions. These materials are described, for example, in Haley, U.S. Pat. No. 5,372,907; Haley, U.S. Pat. No. 5,466,557; and Nguyen, U.S. Pat. No. 5,919,601.

Haley '907 discloses a negative-working radiation-sensitive composition that is sensitive to both ultraviolet and infrared radiation. The composition comprises (1) a resole resin, (2) a novolac resin, (3) a latent Brönsted acid and (4) an infrared absorber. The solubility of the composition in an alkaline developer is both reduced in exposed regions and increased in unexposed regions by the steps of imagewise exposure to imaging radiation and heating.

Nguyen discloses negative-working radiation-sensitive compositions imageable by infrared and ultraviolet/visible radiation. These compositions comprise a thermal-activated acid generator; a crosslinking resin; a binder resin comprising a polymer containing reactive pendant groups selected from hydroxy, carboxylic acid, sulfonamide, and alkoxymethylamides; an infrared absorber; and optionally an ultraviolet/visible radiation-activated acid generator for ultraviolet/visible sensitization. The thermal-activated acid generators are typically latent Brönsted acids.

Latent Brönsted acids described in both inventions are precursors that form a Brönsted acid by thermally or photochemically initiated decomposition. Latent Brönsted acids include, for example, onium salts in which the onium cation is iodonium, sulphonium, diazonium, phosphonium, oxysulphoxonium, oxysulphonium, sulphoxonium, selenonium, arsonium, or ammonium, and the anion is a non-nucleophilic anion selected from tetrafluoroborate, hexafluorophosphate, hexafluoroantimonate, triflate, tetrakis (pentafluoro-phenyl)borate, pentafluoroethyl sulfonate, p-methyl-benzyl sulfonate, ethyl sulfonate, trifluoromethyl acetate, and pentafluoroethyl acetate. Non-ionic latent Brönsted acids include, for example, haloalkyl-substituted s-triazines, which are described, for example, in Smith, U.S. Pat. No. 3,779,778.

The imageable element may be prepared by methods well known in the art. The layers may be applied by, for example, coating, lamination, or extrusion. It is important to avoid intermixing of the layers during this process. If a second layer is coated over a first layer from a solvent or a mixture of solvents, care should be taken so that the solvent or mixture of solvents used to coat the second layer does not dissolve the first layer and cause mixing of the layers.

The advantageous properties of this invention can be observed by reference to the following examples, which illustrate but do not limit the invention.

EXAMPLES

| Glossary | |
|---|---|
| PLURIOL ® P-600 | Polypropylene glycol (BASF, Ludwigshafen, Germany) |
| SYNPERONIC ® T 304 | Poloxamine 304; Polyoxyethylene, polyoxypropylene liquid block copolymer of ethylene diamine (I.C.I. Am., Wilmington, DE, USA) |
| TRITON ® CF32 | Alkylamino-polyethoxypolypropoxy propanol (Rohm & Haas, Philadelphia, PA, USA) |

Example 1

The following developers and replenishers were prepared by stirring the components together:

Developer 1: Water (90.6 kg); 34.9 wt % sodium water glass (7.3 kg), and sodium hydroxide (solid) (2.1 kg).

Replenisher 1: Water (89.1 kg); 34.9 wt % sodium water glass (7.3 kg), and sodium hydroxide (solid) (3.6 kg).

Example 2

This example illustrates loading of developers.

Easyprint™, Virage™, and Capricorn™ DH, positive-working printing plate precursors (imageable elements) are all available from Kodak Polychrome Graphics LLC. Silicate-containing developer 4005 and replenisher 4008 are both available from Kodak Polychrome Graphics LLC.

The plate precursors were cut to a size of 790×850 mm, and exposed with a metal halide lamp (MH-Burner, available from Sack).

A Mercury 850 (Kodak Polychrome Graphics LLC) processor, equipped with an immersion type developing bath, a section for rinsing with water, and a gumming and drying section, was used to develop the exposed plates. The processor was filled with 60 L of developer. If the processor contains more than 60 L of developer, the excess is removed via an overflow. Separately, a container for the appropriate replenisher was attached from which the replenisher was added to the developing bath via a pump.

To keep the activity of the developer bath substantially constant, 40 mL of replenisher was added to the developer bath per 1 $m^2$ of printing plate precursor processed. The following parameters were kept constant in all procedures: temperature of the developing bath: $(23\pm1)°$ C.; and dwell time in the developer: 25 sec.

Five loaded developers were prepared as indicated in Table 1. The Easyprint and Capricorn™ DH plates were exposed with an exposure energy of 570 $mJ/cm^2$. The Virage plates were exposed with an exposure energy of 500 $mJ/cm^2$.

The loading (in $m^2$ of exposed printing plates per L of developer) is shown in Table 1. The resulting developer is referred to as "loaded developer."

TABLE 1

| Developer No. | Precursor | Coating weight (g/m²) | Developer and Replenisher Used | Loading (m²/L) |
|---|---|---|---|---|
| 1 | Easyprint | 1.85 | 1/1 | 14 |
| 2 | Easyprint | 1.85 | 4005/4008 | 12 |
| 3 | Virage | 2.30 | 1/1 | 10 |
| 4 | Virage | 2.30 | 4005/4008 | 12 |
| 5 | Capricorn ™ DH | 2.05 | 4005/4008 | 20 |

Example 3

This example illustrates precipitation of loaded solids.

5 L of each loaded developer was placed in a 10 L beaker. Then 100 g of TRITON® CF32 was slowly added to each loaded developer with stirring. After each loaded developed had been stirred for an additional 30 min, a precipitate formed in each loaded developer. Each precipitate was separated from the developer by either filtration or centrifugation to produce a processed developer as a clear, slightly colored solution.

Each precipitate was dried in a forced-air oven at about 45° C. for about 24 hr and then weighed. The solid content of each aqueous solution was determined with a Mettler LJ 16 moisture analyzer using a drying temperature of 140° and a drying time of 30 min. The results are shown in Table 2.

TABLE 2

| Loaded Developer No. | Weight of Precipitate (g/5 L) | Coating Weight Removed (g/5 L) | Solid Content of Processed Developer (wt %) | Solid Content of Fresh Developer (wt %) |
|---|---|---|---|---|
| 1 | 127.5 | 126.2 | 7.3 | 5.4 |
| 2 | 109 | 105.5 | 14.6 | 12.4 |
| 3 | 134.5 | 131 | 7.2 | 5.4 |
| 4 | 135 | 131 | 14.4 | 12.4 |
| 5 | 119.5 | 117 | 14.5 | 12.4 |

Example 4

This example illustrates processing of a loaded developer using additional polyoxyalkylene derivatives.

SYNPERONIC® 304T and PLURIOL® P-600 (1.5 wt %, based on the weight of the loaded developer) were each added to loaded developer #1 of Example 3 the resulting mixture processed as described in Example 3. In each case an essentially colorless liquid remained after separation of the solids.

Example 5

This example illustrates refreshing of the essentially colorless liquid produced by removal of the solids.

The essentially colorless liquid produced by treatment of loaded developer #4 from Example 1 was used to prepare a refreshed developer. To 10 Kg of essentially colorless liquid was added 13.5 g of 45 wt % of aqueous potassium hydroxide. Then 10 mL of the resulting developer was diluted with 90 mL of deionized water and the resulting solution titrated with 0.5% N HCl using a Titrino DMS 716 (Metrohm). The number of mL of acid required to reach the first equivalence point was 11.3 mL, which is identical with the number of mL of acid required to reach the first equivalence point for developer 4005, the initial developer. This corresponds to an alkalinity level (volume of 0.5 N HCl in mL needed to reach the first inflection point in the titration of 5 mL of developer) of about 5.6.

Example 6

This example illustrates stability and loading of a refreshed developer with printing plates based on novolac resins.

Easyprint™ positive-working printing plate precursors (Kodak Polychrome Graphics LLC), which contain novolac resins and naphthoquinone diazides in the imageable layer, were cut to a size of 790×850 mm and exposed with 510 mJ/cm² of radiation from a metal halide lamp (MH-Burner, available from Sack) through a Foga silver halide film half-step wedge test strip, with an optical density range of 0.15 to 1.95, as a positive copy.

The exposed printing plate precursors were developed in a Mercury processor as described above. The refreshed developer of Example 5 was used to develop the printing plates.

During the test period, the exposed printing plate precursors were developed one after another at a rate of 143 plates per day for 20 days with 3 weekend interruptions. The activity of the refreshed developer was monitored by titration with 0.5 N HCl as described in Example 5. Throughout the run, 30 L of overflow of used developer was collected, which corresponds to 15 mL/m² of developed plate.

During the test period, the development process was not affected by either the formation of foam or the precipitation of insoluble materials on the bottom of the processor. After testing was complete, the processor could be easily cleaned by rinsing with water and no residue remained in the processor.

To evaluate the printing plates, the following were evaluated: steps of the gray wedge that are not covered ("gray scale") and the microlines that have not yet been attacked. The results are given in Table 3.

TABLE 3

Stability and Load Test Using Refreshed Developer

| Throughput (m²/L) | Microlines | Gray Scales | Replenisher (mL/m²) | Titration (mL 0.5 N HCl) |
|---|---|---|---|---|
| 0 | 12 | 3 | — | 11.3 |
| 8 | 12 | 3 | 40 | 11.4 |
| 16 | 12 | 3/4 | 40 | 11.2 |
| 20 | 12/15 | 3/4 | 40 | 11.4 |
| 24 | 12 | 3 | 40 | 11.3 |
| 28 | 12 | 3 | 40 | 11.5 |
| 32 | 12/15 | 3/4 | 40 | 11.3 |

The titration data, as well as the almost constant values for the gray scale and microlines after the development of 1920 m² of printing plates in 60 L of refreshed developer, show that the activity of the developer can be kept constant during a long test period by the addition of 40 mL/m² of replenisher 4008.

Printing plates formed after throughputs of 16, 24, and 32 m²/L were evaluated for ink acceptance and toning. Each of the exposed and developed printing plates was mounted in a sheet-fed offset press and proofed. All of the images accepted ink without any problems and the paper copies did not show any background (toning) in the non-image areas. After about 2,000 copies had been printed, the press was stopped for about 45 min and restarted (restart test). The same results were obtained as were obtained at the beginning of the print run. In all cases the non-image areas did not show any toning, which indicates good protection of the hydrophilic substrate by the developer.

Having described the invention, we now claim the following and their equivalents.

What is claimed is:

1. A method for producing a refreshed developer, the method comprising the steps of:

(a) adding a water-soluble polyoxyalkylene derivative to a loaded silicate-containing developer,
    in which:
    about 0.8 wt % to about 5.0 wt % of the water-soluble polyoxyalkylene derivative, based on the weight of the loaded developer, is added to the loaded developer;
    the polyoxyalkylene derivative comprises recurring units of the —($CH_2$—CHR—O)— structural unit, in which each R is independently hydrogen or methyl;
    the loaded developer comprises loaded solids; and
    the loaded developer has a loaded solids content of about 0.1 wt % to about 10 wt %;

(b) separating insoluble material from the developer and producing an essentially colorless liquid, in which the insoluble material comprises material dispersed in the loaded developer before step (a), a precipitate formed in step (a), or a combination thereof; and (c) adjusting the alkalinity level of the essentially colorless liquid and producing the refreshed developer.

2. The method of claim 1 in which 1.2 wt % to about 2.5 wt % of the water-soluble polyoxyalkylene derivative, based on the weight of the loaded developer, is added to the loaded silicate-containing developer in step (a).

3. The method of claim 1 in which the polyoxyalkylene derivative is selected from the group consisting of polyethylene oxides, polypropylene oxides, copolymers of ethylene oxide and propylene oxide, polycondensation products of at least one $C_2$–$C_3$ alkylene oxide and ethylene diamine, polyoxyalkylated monoamines, and mixtures thereof.

4. The method of claim 3 in which the polyoxyalkylene derivative is a polycondensation products of at least one $C_2$–$C_3$ alkylene oxide and ethylene diamine.

5. The method of claim 3 in which the polyoxyalkylene derivative is a polyoxyalkylated monoamine.

6. The method of claim 3 in which the polyoxyalkylene derivative is selected from the group consisting of polyethylene oxides, polypropylene oxides, and copolymers of ethylene oxide and propylene oxide, and mixtures thereof.

7. The method of claim 6 in which the polyoxyalkylene derivative is a polypropylene oxide.

8. The method of claim 3 in which the alkalinity of the essentially colorless liquid is adjusted to between about 4.5 and about 10.0.

9. The method of claim 3 in which alkalinity of the essentially colorless liquid is adjusted to between about 5.5 and about 8.0.

10. The method of claim 2 in which alkalinity of the essentially colorless liquid is adjusted to between about 5.5 and about 8.0.

11. The method of claim 2 in which the water-soluble polyoxyalkylene derivative is a poloxamine.

12. The method of claim 11 in which the poloxamine is selected from the group consisting of poloxamine 304, poloxamine 504, poloxamine 701, poloxamine 702, poloxamine 704, poloxamine 707, poloxamine 901, poloxamine 904, poloxamine 908, poloxamine 1101, poloxamine 1102, poloxamine 1104, poloxamine 1107, poloxamine 1301, poloxamine 1302, poloxamine 1304, poloxamine 1307, poloxamine 1501, poloxamine 1502, poloxamine 1504, poloxamine 1508, and mixtures thereof.

* * * * *